United States Patent
Wang et al.

(10) Patent No.: US 9,287,863 B2
(45) Date of Patent: Mar. 15, 2016

(54) SWITCH DRIVING CIRCUIT

(71) Applicant: DELTA ELECTRONICS, INC., Taoyuan Hsien (TW)

(72) Inventors: Ming Wang, Taoyuan Hsien (TW); Wei-Liang Fu, Taoyuan Hsien (TW); Qing Cong, Taoyuan Hsien (TW); Jian-Ping Ying, Taoyuan Hsien (TW); Bing Zhang, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 46 days.

(21) Appl. No.: 13/790,737

(22) Filed: Mar. 8, 2013

(65) Prior Publication Data

US 2014/0055172 A1 Feb. 27, 2014

(30) Foreign Application Priority Data

Aug. 21, 2012 (CN) .......................... 2012 1 0298849

(51) Int. Cl.
*H03B 1/00* (2006.01)
*H03K 3/00* (2006.01)
*H03K 17/16* (2006.01)

(52) U.S. Cl.
CPC .............. *H03K 17/16* (2013.01); *H03K 17/162* (2013.01)

(58) Field of Classification Search
CPC .......... H03K 17/04126; H03K 17/063; H03K 2217/0036; H03K 17/601; H03K 17/0826
USPC ................................................... 327/108–112
See application file for complete search history.

(56) References Cited

FOREIGN PATENT DOCUMENTS

| CN | 102280990 | | 12/2011 | |
|----|-----------|---|---------|---|
| CN | 202260990 | | 5/2012 | |
| GB | 2482738 A | * | 2/2012 | ............ H02M 3/156 |
| JP | 4213565 | | 1/2009 | |

* cited by examiner

*Primary Examiner* — Diana J Cheng
(74) *Attorney, Agent, or Firm* — Hauptman Ham, LLP

(57) ABSTRACT

A switch driving circuit for driving a full-controlled power switch is disclosed, including a pulse-width modulation unit, a pulse transformer, an anti-interference module, a pulse-width demodulation unit and a driving-power amplifier. The pulse-width modulation unit converts a driving input signal into a positive-negative narrow pulse-width signal. The anti-interference module is coupled to the secondary side and the positive-negative narrow pulse-width signal includes multiple positive pulses and negative pulses. The anti-interference module filters out the ones from the positive pulses and negative pulses of which the pulse amplitude does not reach an effective threshold, and meanwhile the anti-interference module suppress a common-mode noise caused by a high voltage transient variation at a moment when the full-controlled power switch is turned on or off. The pulse-width demodulation unit converts the filtered positive-negative narrow pulse-width signal into a driving output signal.

14 Claims, 8 Drawing Sheets

SWITCH DRIVING CIRCUIT

RELATED APPLICATIONS

This application claims priority to Chinese Application Serial Number 201210298849.2, filed Aug. 21, 2012, which is herein incorporated by reference.

BACKGROUND

1. Field of Invention

The invention relates to a switch driving circuit. More particularly, the invention relates to a switch driving circuit for driving a full-controlled power switch.

2. Description of Related Art

The insulated gate bipolar transistor (IGBT) is one of the full-controlled power switch elements. The input stage and the output stage of the insulated gate bipolar transistor are integrated into one device respectively through the metal-oxide-semiconductor field-effect transistor (MOSFET) and the PNP bipolar junction transistor (BJT), which has both the features of low driving power, rapid switch speed (control and response) and high input impedance of the MOSFET device and the features of reduced saturation voltage and high capacity of the bipolar device. Currently, the insulated gate bipolar transistor has become the mainstream power device for the high power converter. As the link between the power circuit and the control circuit, the main function of the driving circuit is converting the control signal into the required power driving signal to ensure that the insulated gate bipolar transistor is turned on completely or turned off reliably. Accordingly, the driving circuit plays an important role in transferring the control signal precisely and ensuring the good performance of the full-controlled power switch element.

In the application of the high power converter and the medium power converter, along with the turning on or off of the full-controlled power switch element, a high variation gradient of voltage/current is generated and thus the corresponding noise interference is caused. In such an environment, the driving circuit is required to have a good anti-interference performance so as to ensure that the control signal is transferred precisely and thus the stable and reliable operation of the full-controlled power switch element is realized. At the same time, it is required that the power side and the control side of the driving circuit are well isolated, avoiding that the control circuit is damaged due to serious failure of the main circuit. Accordingly, the design difficulties of the driving circuit are the precise and rapid transmission of the control signal, strong anti-interference performance and good function of isolation between the main circuit and the control circuit.

Currently, in the industry many mature drivers can drive the full-controlled power switch element reliably. When the driving power is low and it is unnecessary to isolate the control signal from the power device, the design of the driving circuit is relatively simple. In the application environment of the high power, when it is necessary to isolate the control signal from the main power device, the common driving methods are as follows: optical coupler isolation driving, optical fiber isolation driving and pulse transformer isolation driving.

The optical coupler driving method has disadvantages as follows: the secondary side of the optical coupler is limited by the power supply source (the power supply for a high-speed optical coupler is generally 5 V), the time delay of the signal transmission is long, the isolation voltage of the primary side and secondary side is not high and the stability is low.

Currently, the optical fiber driving method is widely applied in the high voltage environment. However, it also has the disadvantages as follows: the power supply source of the receiver of the optical fiber is limited (generally 5 V), the stability of the optical fiber is lower than that of a magnetic core element as the plug port of the optical fiber is easy to deposit dusts, and the large number of the optical fibers may cause complicated system wiring and the increased manufacture cost.

Another method uses the pulse transformer isolation driving to drive the full-controlled power switch element. The method is mainly divided into two types: active and passive. The passive method is relatively simple which uses the pulse transformer to drive the full-controlled power switch element directly without the secondary-side power source. In the passive method, the pulse transformer should transfer the driving signal and the power at the same time so that the transformer shall have a volume large enough. As a result, the parasitic capacitance of the primary side and the secondary side of the transformer is increased correspondingly and the common-mode noise interference is serious, which are issues should be avoided in the application of the high power.

In the active method, the pulse transformer only provides the function of transferring the driving control signal and the secondary side provides the corresponding power source. Compared with the passive method, in the active method the magnetic core volume can be reduced. However, if the frequency of the control signal is reduced, the time of high voltage level of the driving control signal may last longer. In order to prevent the saturation of the magnetic core, it is necessary to increase the volume of the magnetic core correspondingly. Similarly, the parasitic capacitance of the primary side and secondary side is increased correspondingly. It can be seen that the volume of the pulse transformer is limited by the operation frequency in the active method.

However, whatever from the view of the active method or the passive method, the pulse transformer causes the issue of parasitic capacitance. In the high power environment, such a parasitic interference noise interferes with the driving control circuit greatly. More serious it may cause the driving circuit to generate an error signal and then the full-controlled power switch element is triggered to turn on or off, which damages the reliability of the system greatly.

SUMMARY

In view of the above, the invention provides a switch driving circuit which realizes anti-interference and common-mode noise suppression effect based on the magnetic isolation transmission technology. The switch driving circuit is applicable to drive the full-controlled power switch element. The switch driving circuit of the invention has a short time delay of transmission, which is not limited by the frequency and pulse width of the control signal. At the same time, the switch driving circuit has an anti-interference and common-mode noise suppression circuit for improving the anti-interference capability. Additionally, with respect to the optical fiber, in the high voltage and high power application, the pulse transformer driving method has high stability and low cost.

An aspect of the invention provides a switch driving circuit for driving a full-controlled power switch. The switch driving circuit includes a pulse-width modulation unit, a pulse transformer, an anti-interference module, a pulse-width demodulation unit and a driving-power amplifier. The pulse-width modulation unit converts a driving input signal into a positive-negative narrow pulse-width signal. The pulse transformer has a primary side and a secondary side. The primary side is coupled to the pulse-width modulation unit and the positive-negative narrow pulse-width signal is transferred to the secondary side through the pulse transformer. The anti-interference module is coupled to the secondary side. The positive-negative narrow pulse-width signal includes a plurality of positive pulses and a plurality of negative pulses. Each of the positive pulses and the negative pulses has pulse amplitude. The anti-interference module filters out the ones from the positive pulses and the negative pulses of which the pulse amplitude does not reach an effective threshold. The pulse-width demodulation unit is coupled to the anti-interference module for converting the filtered positive-negative narrow pulse-width signal into a driving output signal. The driving-power amplifier is coupled between the pulse-width demodulation unit and the full-controlled power switch.

According to an embodiment of the invention, the anti-interference module includes a first anti-interference circuit and a second anti-interference circuit which are coupled to a positive polarity terminal and a negative polarity terminal of the secondary side respectively. Each of the first anti-interference circuit and the second anti-interference circuit includes a comparator, a first resistor, a second resistor (optional) and a third resistor. The comparator has a positive input terminal and a negative input terminal. The first resistor is coupled between the positive input terminal and a power supply voltage. The second resistor (optional) is coupled between the positive input terminal and a ground terminal. The third resistor is coupled between the negative input terminal and the ground terminal. In the first anti-interference circuit, the negative input terminal of the comparator is coupled to the positive polarity terminal and the positive input terminal is coupled to the negative polarity terminal. In the second anti-interference circuit, the positive input terminal of the comparator is coupled to the positive polarity terminal and the negative input terminal is coupled to the negative polarity terminal.

According to another embodiment of the invention, the resistance value of the first resistor and the second resistor (optional) is approximately equal to the resistance value of the third resistor.

According to still another embodiment of the invention, the first anti-interference circuit further includes a fourth resistor and a fifth resistor. The fourth resistor is coupled between the positive input terminal of the comparator in the first anti-interference circuit and the negative polarity terminal. The fifth resistor is coupled between the negative input terminal of the comparator in the first anti-interference circuit and the positive polarity terminal. The resistance value of the fourth resistor is approximately equal to the resistance value of the fifth resistor.

According to yet still another embodiment of the invention, the second anti-interference circuit further includes a fourth resistor and a fifth resistor. The fourth resistor is coupled between the positive input terminal of the comparator in the second anti-interference circuit and the positive polarity terminal. The fifth resistor is coupled between the negative input terminal of the comparator in the second anti-interference circuit and the negative polarity terminal. The resistance value of the fourth resistor is approximately equal to the resistance value of the fifth resistor.

According to an embodiment of the invention, the pulse-width demodulation unit includes a logic chip for setting and resetting. The logic chip includes a setting input terminal and a resetting input terminal. An output terminal of the comparator in the first anti-interference circuit is coupled to the setting input terminal and an output terminal of the comparator in the second anti-interference circuit is coupled to the resetting input terminal.

According to another embodiment of the invention, each of the driving input signal and the driving output signal is a pulse-width modulation signal. Each of the plurality of positive pulses of the narrow pulse-width signal corresponds to each of a plurality of rising edges of the driving input signal or the driving output signal. Each of the plurality of negative pulses of the narrow pulse-width signal corresponds to each of a plurality of falling edges of the driving input signal or the driving output signal.

Another aspect of the invention provides a switch driving circuit for driving a full-controlled power switch. The switch driving circuit includes a signal processing circuit, a pulse transformer, an anti-interference module and a driving-power amplifier. The signal processing circuit amplifies the driving capability of an ultra-high frequency driving input signal to generate an ultra-high frequency driving signal. The pulse transformer has a primary side and a secondary side. The primary side is coupled to the signal processing circuit and the ultra-high frequency driving signal is transferred to the secondary side through the pulse transformer. The anti-interference module is coupled to the secondary side. The ultra-high frequency driving signal includes a plurality of pulses. The anti-interference module filters out the ones from the pulses of which the pulse amplitude do not reach an effective threshold. The driving-power amplifier is coupled between the anti-interference module and the full-controlled power switch.

According to an embodiment of the invention, the anti-interference module includes a first anti-interference circuit and a second anti-interference circuit which are coupled to a positive polarity terminal and a negative polarity terminal of the secondary side respectively. Each of the first anti-interference circuit and the second anti-interference circuit includes a comparator, a first resistor, a second resistor (optional) and a third resistor. The comparator has a positive input terminal and a negative input terminal. The first resistor is coupled between the positive input terminal and a power supply voltage. The second resistor (optional) is coupled between the positive input terminal and a ground terminal. The third resistor is coupled between the negative input terminal and the ground terminal. In the first anti-interference circuit, the negative input terminal of the comparator is coupled to the positive polarity terminal and the positive input terminal is coupled to the negative polarity terminal. In the second anti-interference circuit, the positive input terminal of the comparator is coupled to the positive polarity terminal and the negative input terminal is coupled to the negative polarity terminal.

In the above-mentioned embodiment, the resistance value of the first resistor and the second resistor (optional) is approximately equal to the resistance value of the third resistor. Each of the first anti-interference circuit and the second anti-interference circuit further includes a fourth resistor and a fifth resistor. The fourth resistor is coupled between the positive input terminal and the negative polarity terminal. The fifth resistor is coupled between the negative input terminal and the positive polarity terminal. The resistance value of the fourth resistor is approximately equal to the resistance value of the fifth resistor.

According to another embodiment of the invention, the anti-interference module includes an anti-interference circuit and an impedance matching circuit which are coupled to a positive polarity terminal and a negative polarity terminal of the secondary side respectively. The impedance matching circuit matches the impedance of the anti-interference circuit.

The anti-interference circuit includes a comparator, a first resistor, a second resistor (optional) and a third resistor. The comparator has a positive input terminal and a negative input terminal. The negative input terminal is coupled to the positive polarity terminal and the positive input terminal is coupled to the negative polarity terminal. The first resistor is coupled between the positive input terminal and a power supply voltage. The second resistor (optional) is coupled between the positive input terminal and a ground terminal. The third resistor is coupled between the input terminal and the ground terminal.

In the above-mentioned embodiment, the resistance value of the first resistor and the second resistor (optional) is approximately equal to the resistance value of the third resistor. The anti-interference circuit further includes a fourth resistor and a fifth resistor. The fourth resistor is coupled between the positive input terminal of the comparator in the anti-interference circuit and the negative polarity terminal. The fifth resistor is coupled between the negative input terminal of the comparator in the anti-interference circuit and the positive polarity terminal. The resistance value of the fourth resistor is approximately equal to the resistance value of the fifth resistor.

DETAILED DESCRIPTION

Figure 1:
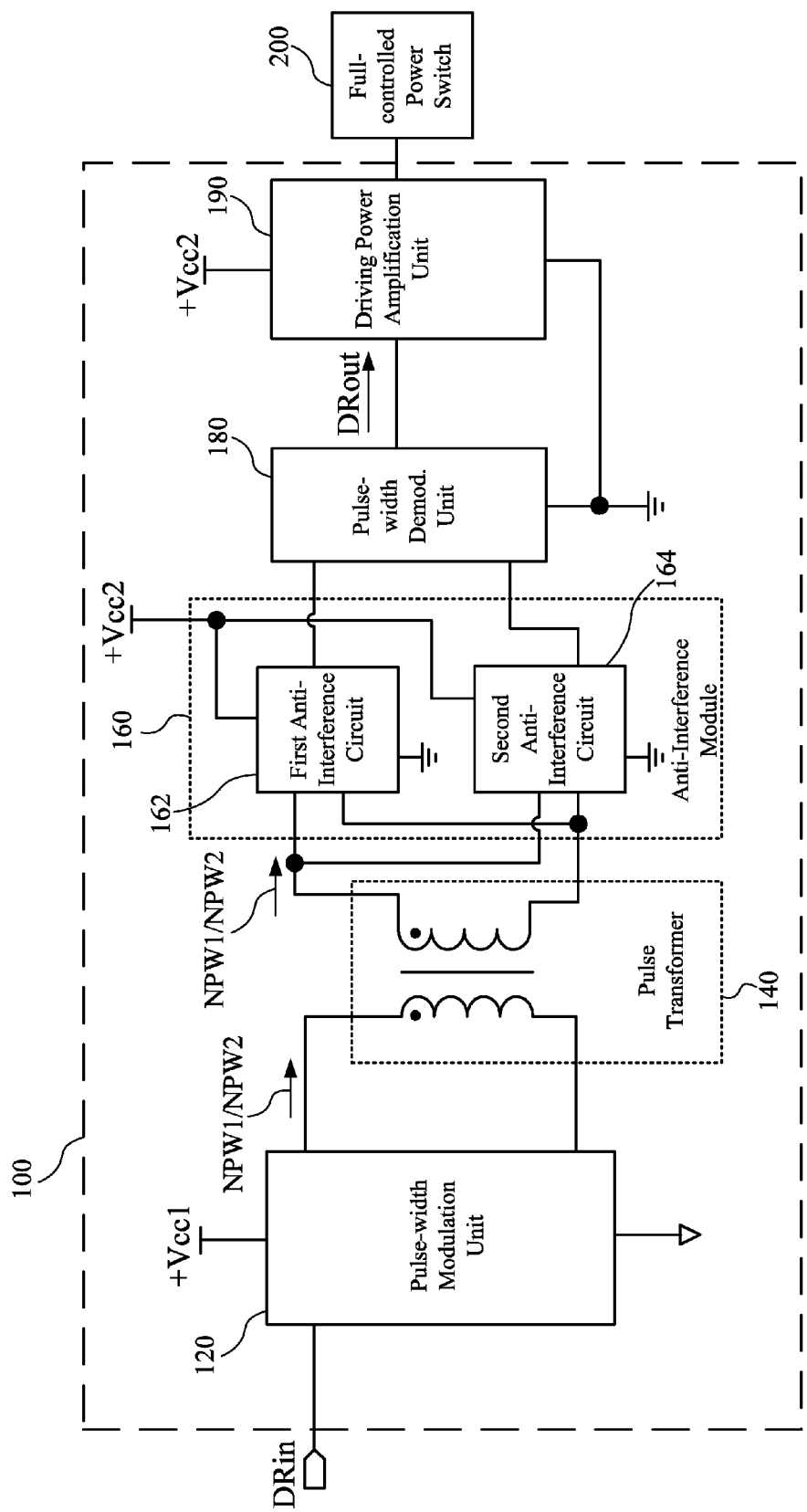
FIG. 1 illustrates a functional block diagram of a switch driving circuit according to a first embodiment of the invention.

Embodiments of the invention are disclosed below with reference to the drawings. For purpose of clear illustration, various details in practice will be illustrated together in the description below. However, it should be understood that the invention is not limited to these details in practice. In other words, in some embodiments of the invention, these details in practice are unnecessary. Additionally, in order to simplify the drawings, some conventional and common structures and elements are illustrated in the drawings by a simple and schematic manner.

Referring to FIG. 1, it illustrates a functional block diagram of a switch driving circuit 100 according to a first embodiment of the invention. As shown in FIG. 1, the switch driving circuit 100 includes a pulse-width modulation unit 120, a pulse transformer 140, an anti-interference module 160, a pulse-width demodulation unit 180 and a driving-power amplifier 190. The switch driving circuit 100 is coupled to a full-controlled power switch 200. The switch driving circuit 100 receives a driving input signal DRin and converts the driving input signal DRin into a driving output signal DRout. The driving output signal DRout is used for controlling the full-controlled power switch 200. In the embodiments of the invention, the full-controlled power switch 200 may include at least one set of IGBTs.

The switch driving circuit 100 magnetically isolates the driving input signal DRin from the driving output signal DRout through the pulse transformer 140 so as to avoid the mutual influence between the driving input signal DRin and the driving output signal DRout.

Figure 2:
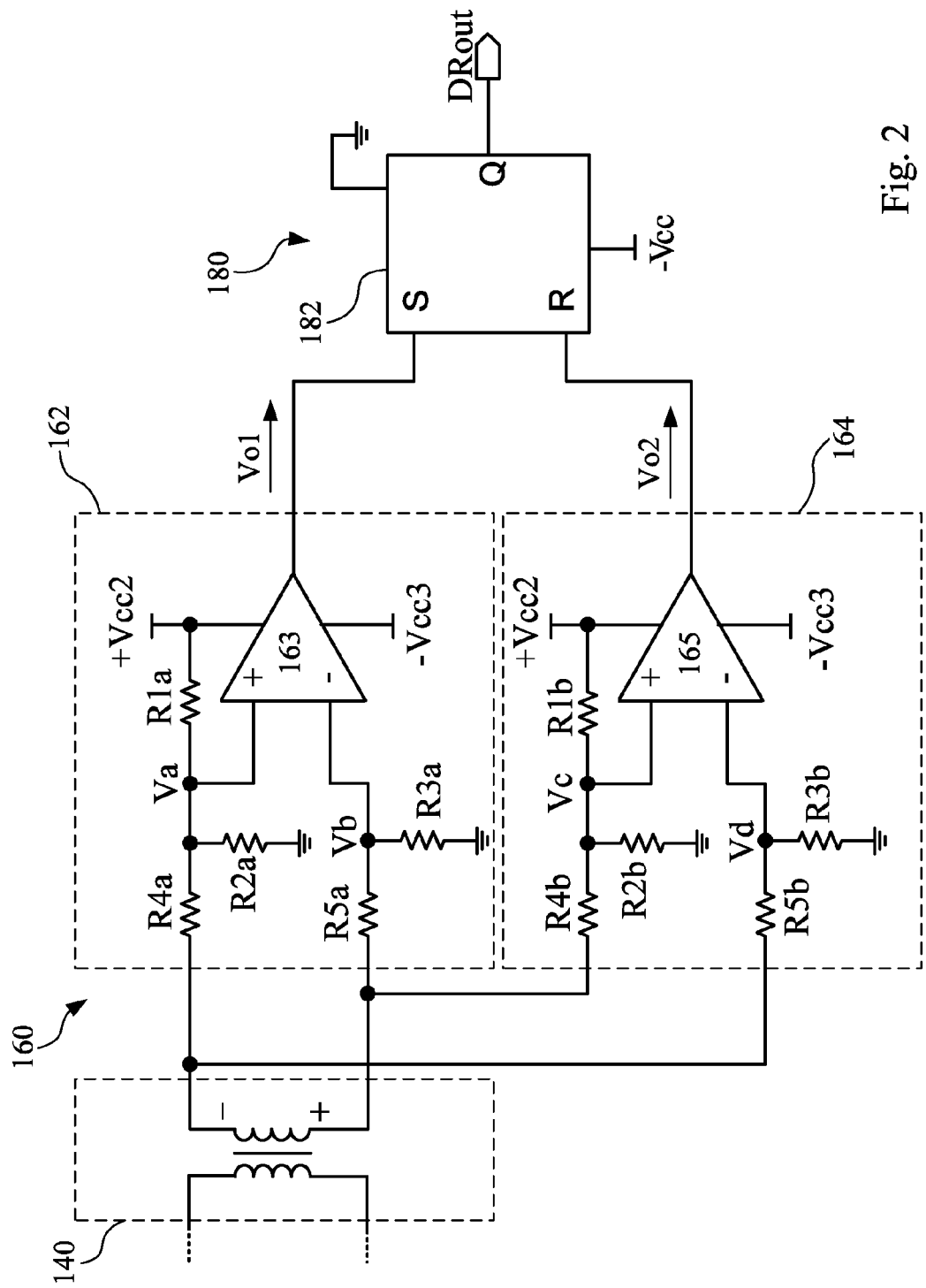
FIG. 2 illustrates a schematic circuit diagram of the switch driving circuit and the anti-interference module thereof according to the first embodiment.
Figure 3:
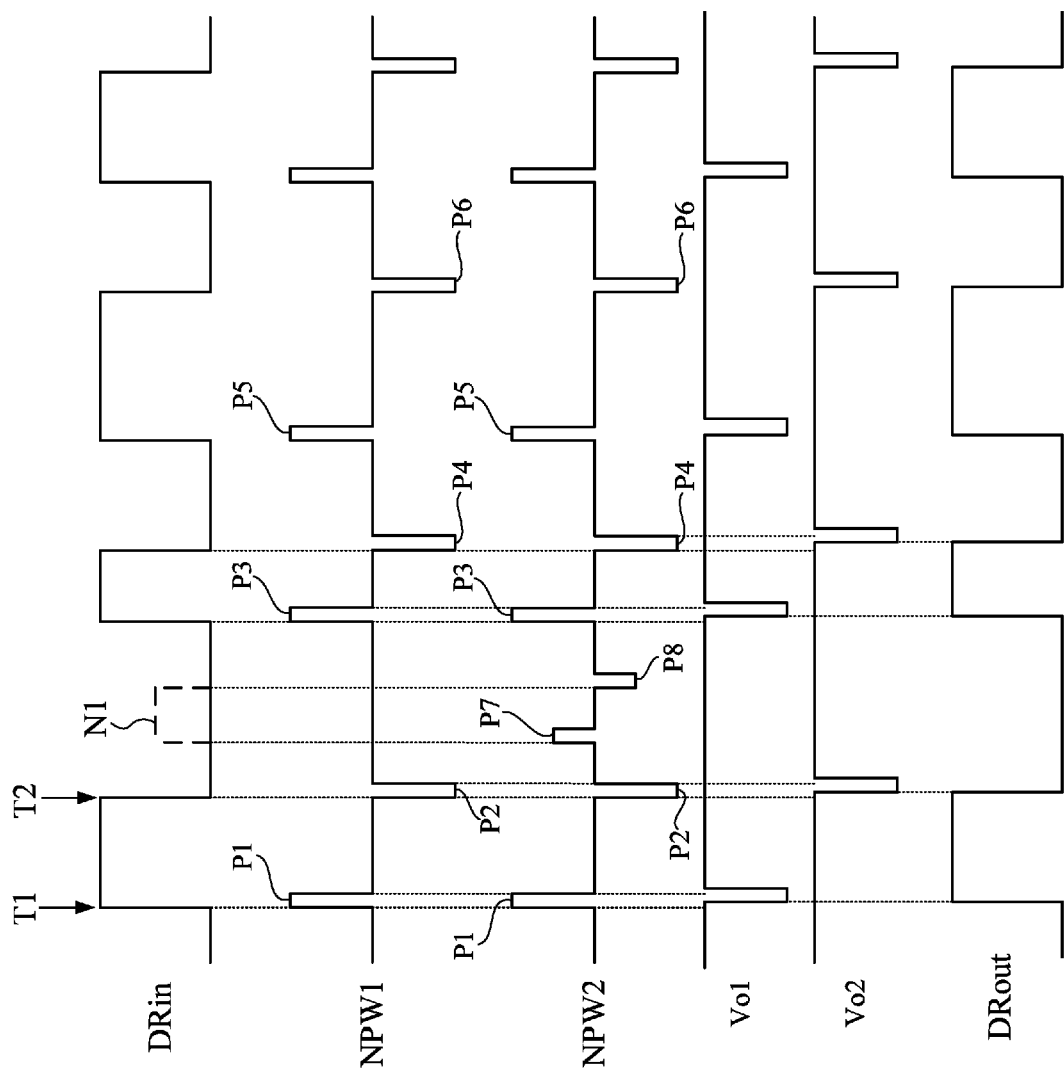
FIG. 3 illustrates a schematic wave form diagram of each signal of the switch driving circuit according to the first embodiment.

Referring both FIGS. 2 and 3, FIG. 2 illustrates a schematic circuit diagram of the switch driving circuit 100 and the anti-interference module 160 thereof according to the first embodiment. FIG. 3 illustrates a schematic wave form diagram of each signal of the switch driving circuit 100 according to the first embodiment.

As shown in FIGS. 1 and 3, the pulse-width modulation unit 120 converts the driving input signal DRin into a positive-negative narrow pulse-width signal (such as the positive-negative narrow pulse-width signal NPW1 in the ideal condition shown in FIG. 3). In this embodiment, the driving input signal DRin is a pulse-width modulation (PWM) signal. In the ideal condition (i.e., when the driving input signal DRin has no interference noise N1), the pulse-width modulation unit 120 converts the PWM driving input signal DRin into the positive-negative narrow pulse-width signal NPW1. The positive-negative narrow pulse-width signal NPW1 includes a plurality of positive pulses (such as the positive pulses P1, P3 and P5 shown in FIG. 3) and a plurality of negative pulses (such as the negative pulses P2, P4 and P6 shown in FIG. 3). Each of the plurality of positive pulses (P1, P3 and P5) corresponds to each of a plurality of rising edges of the driving input signal DRin. Each of the plurality of the negative pulses (P2, P4 and P6) corresponds to each of a plurality of falling edges of the driving input signal DRin, as shown in FIG. 3.

The pulse transformer 140 has a primary side and a secondary side. The positive-negative narrow pulse-width signal NPW1 converted by the pulse-width modulation unit 120 is transferred to the primary side of the pulse transformer 140 and then is transferred to the secondary side through the pulse transformer 140.

The anti-interference module 160 is coupled to the secondary side of the pulse transformer 140. Each of the positive pulses and the negative pulses has its pulse amplitude. The anti-interference module 160 filters out the ones from the positive pulses and the negative pulses of which the pulse amplitude does not reach an effective threshold. For example, in the embodiment of FIG. 3, when the secondary side of the transformer has an interference signal with a low voltage amplitude in the whole circuit operation process, if the amplitude of the interference signal reaches the effective threshold set by the anti-interference module 160, the anti-interference module 160 can filter the corresponding interference noise so as to realize the anti-interference effect.

Then, the pulse-width demodulation unit 180 is coupled to the anti-interference module 160 and converts the filtered positive-negative narrow pulse-width signal into the driving output signal DRout. In this embodiment, the driving output signal DRout also may be a PWM driving signal. Subsequently, the driving-power amplifier 190 coupled between the pulse-width demodulation unit 180 and the full-controlled power switch 200 amplifies the power of the driving output signal DRout and then the driving output signal DRout is transferred to the full-controlled power switch 200.

In the actual application condition, the driving input signal DRin may have interference noise N1 with low voltage amplitude. At this time, the pulse-width modulation unit 120 converts the driving input signal DRin into the positive-negative narrow pulse-width signal NPW2 in the actual application shown in FIG. 3. The positive-negative narrow pulse-width signal NPW2 includes a plurality of positive pulses and a plurality of negative pulses. In addition to the normal positive pulses P1, P3 and P5 and negative pulses P2, P4 and P6, the positive pulse P7 and the negative pulse P8 which are generated due to the interference noise N1 are further included.

In the first embodiment, the anti-interference module 160 includes a first anti-interference circuit 162 and a second anti-interference circuit 164. The first anti-interference circuit 162 and the second anti-interference circuit 164 filter out pulses in the positive-negative narrow pulse-width signal NPW2 (such as the positive pulse P7 and the negative pulse P8) from the positive pulses (corresponding to the positive pulses P1, P3, P5 and P7) and the negative pulses (corresponding to the negative pulses P2, P4, P6 and P8) of which the pulse amplitudes do not reach an effective threshold, so as to realize the anti-interference and common-mode noise suppression effect. The detailed implementation content is described as follows. Furthermore, the above-mentioned positive pulse P7 and negative pulse P8 are not limited to be generated due to the interference noise N1 of the driving input signal DRin. In another example, even if the driving input signal DRin has no interference noise N1, when the positive-negative narrow pulse-width signal NPW2 is passing through the pulse transformer 140, some interference may be generated so that the positive-negative narrow pulse-width signal NPW2 outputted from the secondary side has the above-mentioned positive pulse P7 and negative pulse P8. In other words, the anti-interference module 160 of the invention can filter out pulses, whose the pulse amplitudes do not reach the effective threshold, in the positive-negative narrow pulse-width signal NPW2.

As shown in FIG. 2, in the first embodiment, the anti-interference module 160 includes a first anti-interference circuit 162 and a second anti-interference circuit 164 which are coupled to the positive polarity terminal and the negative polarity terminal of the secondary side of the pulse transformer 140 respectively.

Each of the first anti-interference circuit 162 and the second anti-interference circuit 164 includes a comparator (163 and 165), a first resistor (R1$a$ and R1$b$), a second resistor (R2$a$ and R2$b$) (optional) and a third resistor (R3$a$ and R3$b$). The first anti-interference circuit 162 approximately corresponds to the second anti-interference circuit 164 in terms of architecture. For the purpose of simple illustration, the first anti-interference circuit 162 is taken as an example in the following description.

In the first anti-interference circuit 162, the comparator 163 has a positive input terminal and a negative input terminal. The first resistor R1$a$ is coupled between the positive input terminal of the comparator 163 and a power supply voltage +Vcc2. The second resistor R2$a$ (optional) is coupled between the positive input terminal of the comparator 163 and a ground terminal. The first resistor R1$a$ and the second resistor R2$a$ (optional) can form a voltage division circuit to input the voltage division result of the power supply voltage +Vcc2 into the positive input terminal of the comparator 163. The third resistor R3$a$ is coupled between the negative input terminal of the comparator 163 and the ground terminal.

Moreover, the first anti-interference circuit 162 further includes a fourth resistor R4$a$ and a fifth resistor R5$a$. The fourth resistor R4$a$ is coupled between the positive input terminal of the comparator 163 and the negative polarity terminal of the secondary side of the pulse transformer 140. The fifth resistor R5$a$ is coupled between the negative input terminal of the comparator 163 and the positive polarity terminal of the secondary side of the pulse transformer 140.

In a preferred embodiment, the resistance value of the first resistor R1$a$ and the second resistor R2$a$ (optional) is approximately equal to the resistance value of the third resistor R3$a$. At the same time, the resistance value of the fourth resistor R4$a$ is approximately equal to the resistance value of the fifth resistor R5$a$. In this way, for the positive polarity terminal and the negative polarity terminal of the secondary side of the pulse transformer 140, various impedances generated in the first anti-interference circuit 162 are equal for the positive polarity terminal (R1$a$ R2$a$+R4$a$) and the negative polarity terminal (R3$a$+R5$a$), thereby completing the impedance matching and realizing the common-mode noise suppression effect.

Additionally, the second anti-interference circuit 164 includes a comparator 165, a first resistor R1$b$, a second resistor R2$b$ (optional) and a third resistor R3$b$. The connection architecture of the second anti-interference circuit 164 is approximately similar or symmetrical to that of the first anti-interference circuit. In the second anti-interference circuit, the positive input terminal of the comparator 165 is coupled to the positive polarity terminal of the secondary side and the negative input terminal of the comparator 165 is coupled to the negative polarity terminal of the secondary side. The second anti-interference circuit 164 further includes a fourth resistor R4$b$ and a fifth resistor R5$b$. The fourth resistor R4$b$ is coupled between the positive input terminal of the comparator 165 and the positive polarity terminal of the secondary side. The fifth resistor R5$b$ is coupled between the negative input terminal of the comparator 165 and the negative polarity terminal of the secondary side.

In another preferred embodiment, the resistance value of the first resistor R1$b$ and the second resistor R2$b$ (optional) is approximately equal to the resistance value of the third resistor R3$b$. At the same time, the resistance value of the fourth resistor R4$b$ is approximately equal to the resistance value of the fifth resistor R5$b$. In this way, for the positive polarity terminal and the negative polarity terminal of the secondary side of the pulse transformer 140, various impedances generated in the second anti-interference circuit 164 are equal for the positive polarity terminal (R1$b$‖R2$b a$+R4$b$) and the negative polarity terminal (R3$b$+R5$b$), thereby completing the impedance matching and realizing the common-mode noise suppression effect. In this embodiment, the corresponding resistance elements in the first anti-interference circuit 162 and the second anti-interference circuit 164 may further have the same resistance value or the equal proportional resistance value to improve the impedance matching effect.

It should be supplemented that in this embodiment the power supply voltage +Vcc2 used by the secondary side may be different from the power supply voltage +Vcc1 used by the primary side.

Referring both FIGS. 2 and 3, in this embodiment, the pulse-width demodulation unit 180 may include a logic chip 182 for setting and resetting. The logic chip 182 includes a setting input terminal (S terminal) and a resetting input terminal (R terminal). The output terminal of the comparator 163 in the first anti-interference circuit 162 is coupled to the setting input terminal (S terminal) and the output terminal of the comparator 165 in the second anti-interference circuit 164 is coupled to the resetting input terminal (R terminal).

At the time point T1 in FIG. 3, i.e., when the driving input signal DRin is on the rising edge, the positive-negative narrow pulse-width signal NPW2 forms the positive pulse P1. At this time, from the positive polarity terminal of the secondary side, the positive pulse P1 passes through R5a and R3a for the impedance voltage division (voltage level Vb) and then it is coupled to the negative input terminal of the comparator 163. When the pulse amplitude of the positive pulse P1 exceeds a predetermined effective threshold (i.e., voltage level Va), the comparator is reversed and outputs the effective signal. In this example, the voltage level of the output terminal of the comparator 163 then turns from the high level to the low level. The setting input terminal (S terminal) of the logic chip 182 further changes the voltage level of the driving output signal DRout to a high level. The effective threshold can be adjusted through the voltage division result of the first resistor R1a and the second resistor R2a (optional).

The connection method of the input terminal of the comparator also can be exchanged. Correspondingly, the logic chip 182 is changed to a logic chip for setting and resetting which inputs a reverse efficient electrical level.

At the time point T2 in FIG. 3, i.e., when the driving input signal DRin is on the falling edge, the positive-negative narrow pulse-width signal NPW2 forms the negative pulse P2. At this time, the second anti-interference circuit 164 is actuated and the voltage level of the negative pulse P2 is changed to Vd. From the negative polarity terminal of the secondary side, the negative pulse P2 passes through R5b and R3b for the impedance voltage division (voltage level Vd) and then it is coupled to the negative input terminal of the comparator 165. When the pulse amplitude of the negative pulse P2 exceeds the predetermined effective threshold (i.e., voltage level Vc), the comparator is reversed and outputs the effective signal. In this example, the voltage level of the output terminal of the comparator 165 then turns from the high level to the low level. The resetting input terminal (R terminal) of the logic chip 182 for setting and resetting further changes the voltage level of the driving output signal DRout to the low level. The effective threshold (i.e., voltage level Vc) can be adjusted through the voltage division result of the first resistor R1b and the second resistor R2b (optional).

When the driving input signal DRin has the noise interference N1 with a low voltage amplitude (alternatively, when the positive-negative narrow pulse-width signal NPW2 is passing through the pulse transformer 140, some interference are generated so that the positive-negative narrow pulse-width signal NPW2 outputted from the secondary side has the above-mentioned positive pulse P7 and the negative pulse P8), if at this time the amplitude of the voltage level Vb of the first anti-interference circuit 162 does not reach the set effective threshold (i.e., voltage level Va) and the amplitude of the voltage level Vd of the second anti-interference circuit 164 does not reach the set effective threshold (i.e., voltage level Vc), i.e., when Vb<Va and Vd<Vc, the output results of the comparators 163 and 165 are not reversed, thereby filtering the positive/negative pulses P7 and P8 with a low voltage amplitude as the interference signals to further realize the anti-interference effect.

In the above-mentioned embodiment, the first anti-interference circuit 162 and the second anti-interference circuit 164 in the anti-interference module 160 can be actuated respectively corresponding to the rising edge and the falling edge of the driving input signal DRin and filter the interference noise which does not reach the effective threshold. In this embodiment, the first anti-interference circuit 162 and the second anti-interference circuit 164 both have the design of impedance matching to realize the anti-interference and common-mode noise suppression effect.

When the power device is turned on or off, the large voltage transient variation will be caused correspondingly. A certain common-mode current is generated due to the occurrence of the parasitic capacitance in the circuit. In this embodiment, the resistance value of the positive polarity terminal [(R1b∥R2b)+R4b] is equal to the resistance value of the negative polarity terminal (R3b+R5b). Therefore, the common-mode voltage generated by the common-mode current and applied to the positive input terminal of the comparator is equal to the common-mode voltage generated by the common-mode current and applied to the negative input terminal of the comparator. The common-mode voltages are not converted into the differential mode voltages which otherwise causes the falsely reversion output of the comparator. Thus the excellent common-mode noise suppression capability is realized.

Figure 4:
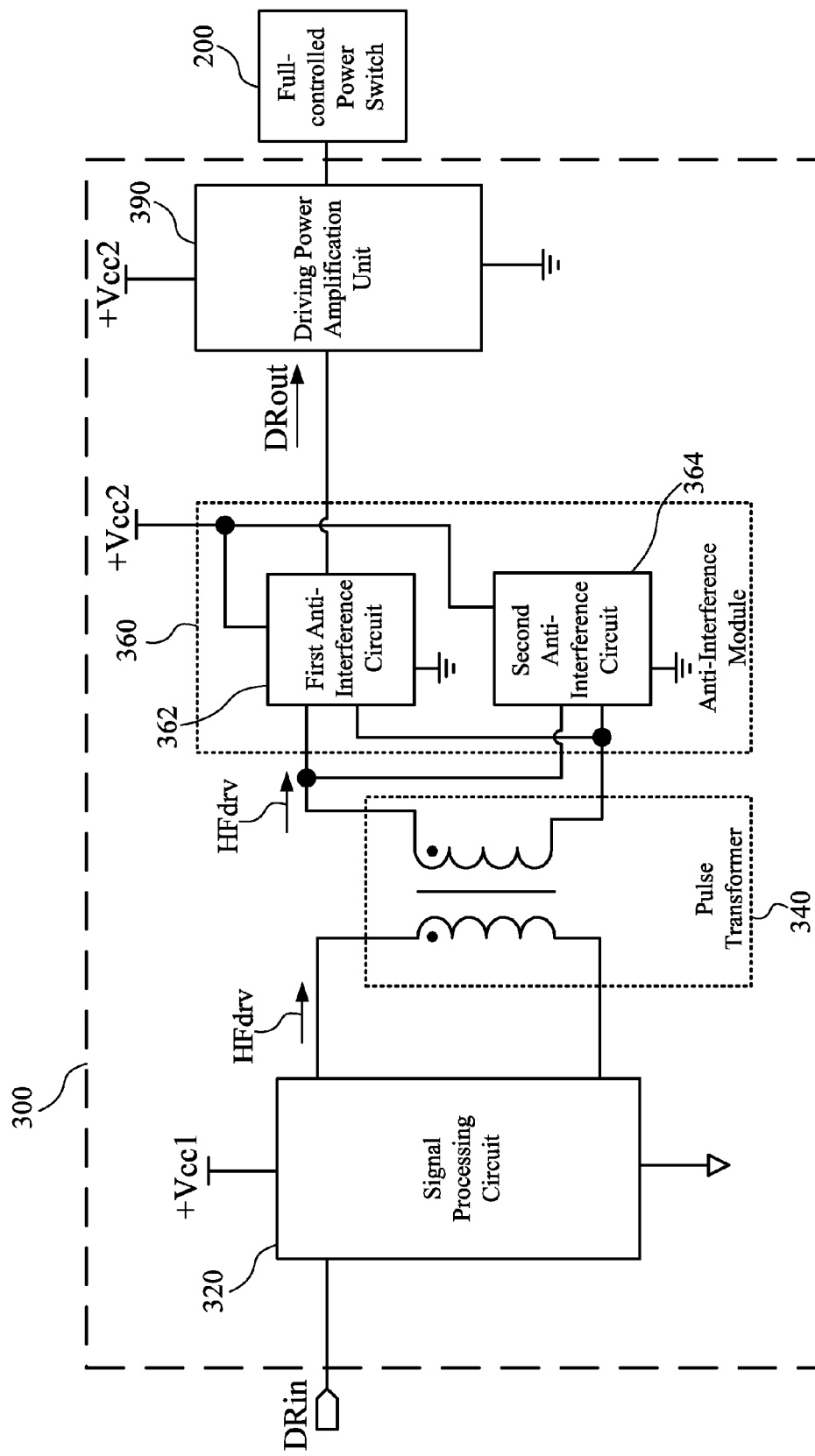
FIG. 4 illustrates a functional block diagram of a switch driving circuit according to a second embodiment of the invention.
Figure 5:
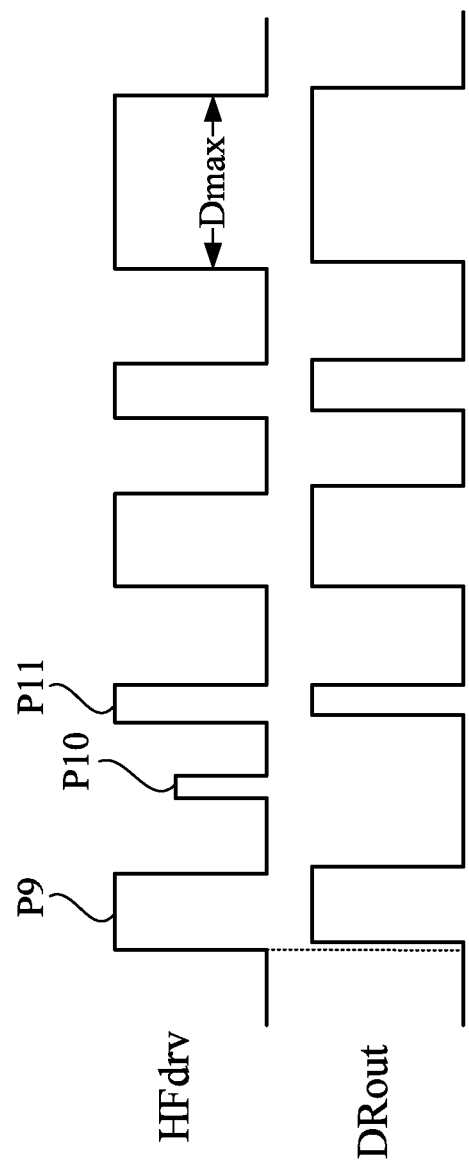
FIG. 5 illustrates a schematic wave form diagram of each signal of the switch driving circuit according to the second embodiment.

Referring both FIGS. 4 and 5, FIG. 4 illustrates a functional block diagram of a switch driving circuit 300 according to the second embodiment of the invention; and FIG. 5 illustrates a schematic wave form diagram of each signal of the switch driving circuit 300 according to the second embodiment.

With the development of the semiconductor technology, the feature of the power device switch is improved greatly inevitably. The operation frequency of the power device switch will be very high. At this time, the frequency of the corresponding driving control signal may also be increased. When the driving control signal is an ultra-high frequency driving input signal, the pulse width of the maximum duty ratio (such as Dmax in FIG. 5) corresponding to the ultra-high frequency driving input signal is very small. The magnetic core transmission technology and the same anti-interference circuit also can transfer the ultra-high frequency signal and drive the power device, such as the switch driving circuit 300 in the second embodiment.

As shown in FIG. 4, according to the second embodiment of the invention, the switch driving circuit 300 includes a signal processing circuit 320, a pulse transformer 340, an anti-interference module 360 and a driving-power amplifier 390. The signal processing circuit 320 amplifies the driving capability of the ultra-high frequency driving input signal DRin to output an ultra-high frequency driving signal HFdrv with a certain driving capability. The pulse transformer 340 has a primary side and a secondary side. The primary side is coupled to the signal processing circuit 320 and the ultra-high frequency driving signal HFdrv is transferred to the secondary side through the pulse transformer 340. The anti-interference module 360 is coupled to the secondary side.

As shown in FIG. 5, the ultra-high frequency driving signal HFdrv includes a plurality of pulses (the positive pulses P9, P10 and P11 in this embodiment). The anti-interference module filters out the ones of which the pulse amplitudes do not reach an effective threshold from the pulses of the ultra-high frequency driving signal HFdrv (such as filtering out the positive pulse P10 in FIG. 5). The driving-power amplifier 390 is coupled between the anti-interference module 360 and the full-controlled power switch 200.

In the second embodiment, the anti-interference module 360 includes a first anti-interference circuit 362 and a second anti-interference circuit 364 so as to realize the anti-interference and common-mode noise suppression effect. The internal architectures of the first anti-interference circuit 362 and the second anti-interference circuit 364 in the second embodiment may be similar to the internal architectures of the first anti-interference circuit 162 and the second anti-interference circuit 164 in the first embodiment (as shown in FIG. 2). The internal architecture of the first anti-interference circuit 362 and the second anti-interference circuit 364 in the second embodiment can be understood with reference to FIG. 2 and the detailed description thereof and will not be illustrated in details any further herein.

Additionally, in the second embodiment in FIGS. 4 and 5, since the ultra-high frequency driving signal HFdrv only has the forward pulse wave form, it mainly focuses on using the actuation of the first anti-interference circuit 362 included in the anti-interference module 360. The second anti-interference circuit 364 is mainly used to realize the impedance matching effect only.

Figure 6:
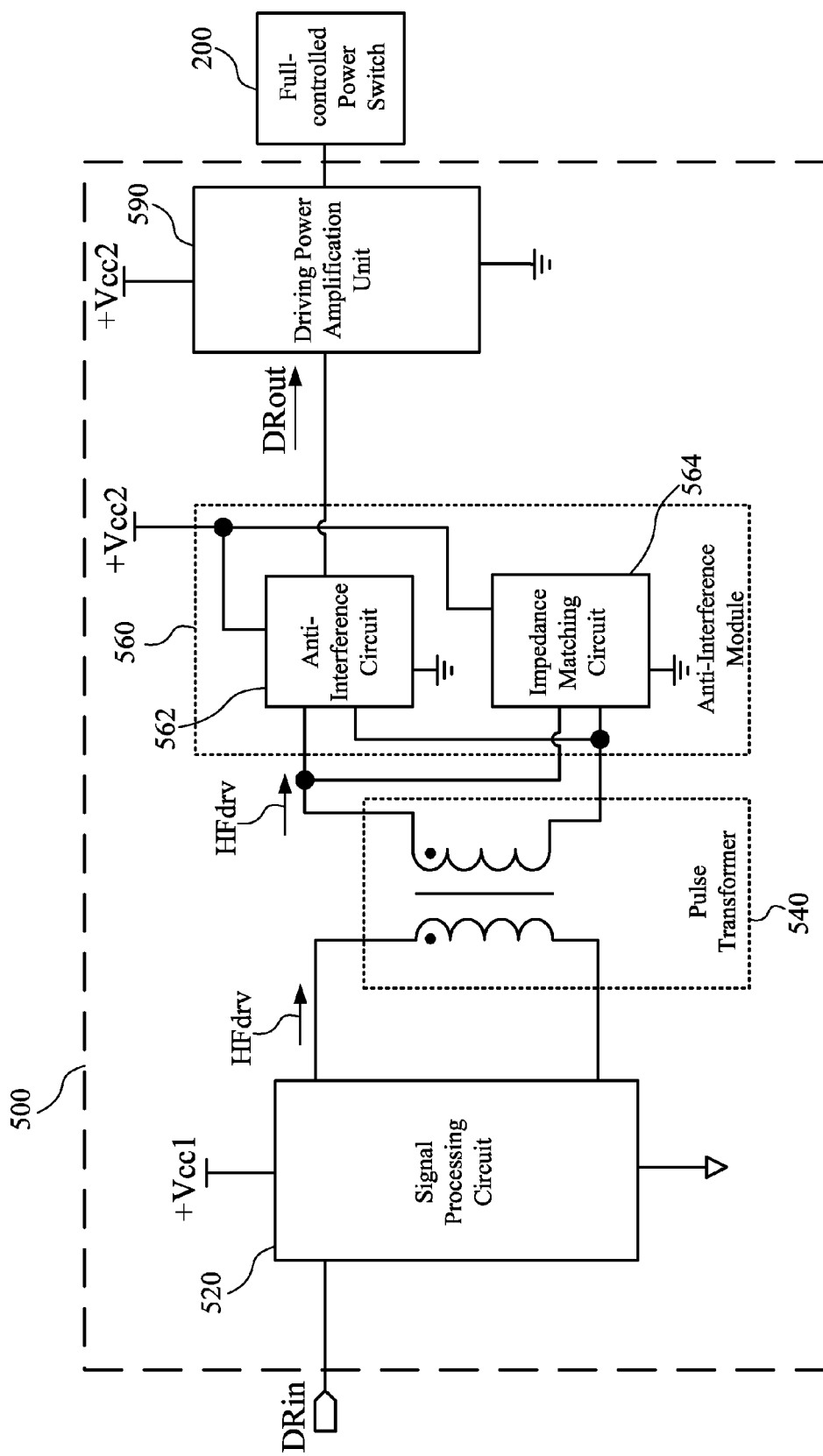
FIG. 6 illustrates a functional block diagram of a switch driving circuit according to a third embodiment of the invention.
Figure 7:
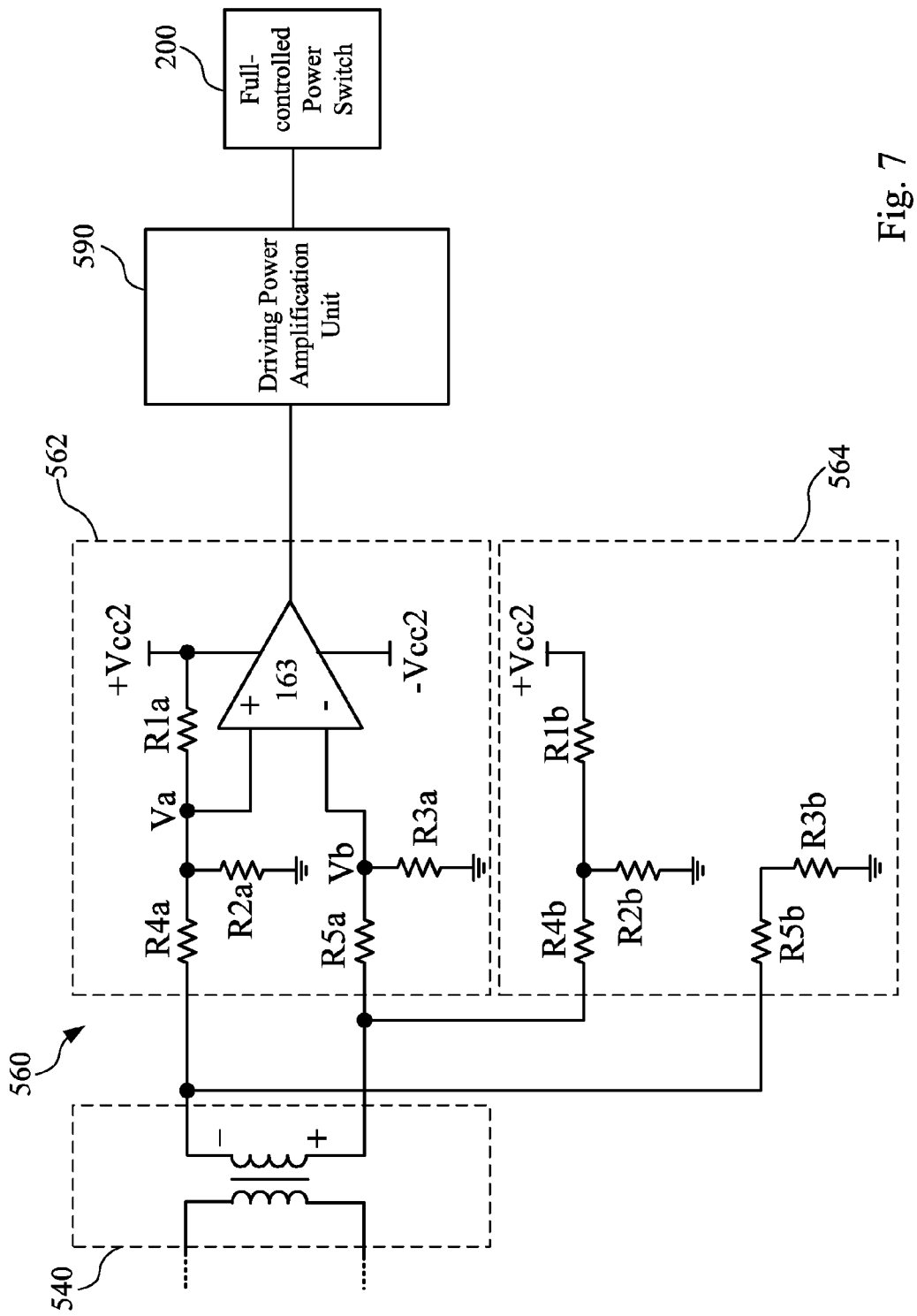
FIG. 7 illustrates a schematic circuit diagram of the switch driving circuit and the anti-interference module thereof according to the third embodiment.

Accordingly, referring both FIGS. 6 and 7, FIG. 6 illustrates a functional block diagram of a switch driving circuit 500 according to the third embodiment of the invention. FIG. 7 illustrates a schematic circuit diagram of the switch driving circuit 500 and the anti-interference module 560 thereof according to the third embodiment.

In the third embodiment, the switch driving circuit 500 includes a signal processing circuit 520, a pulse transformer 540, an anti-interference module 560 and a driving-power amplifier 590. The specific architecture of the switch driving circuit 500 in the third embodiment is approximately the same as that in the second embodiment.

The difference is that in the third embodiment the anti-interference module 560 includes an anti-interference circuit 562 and an impedance matching circuit 564. As shown in FIG. 7, in the third embodiment, the anti-interference circuit 562 includes a comparator 563, a first resistor R1a, a second resistor R2a (optional), a third resistor R3a, a fourth resistor R4a and a fifth resistor R5a. The connection relationship of the internal elements and the actuation principle of the anti-interference circuit 562 are similar to that of the anti-interference circuit 162 in the first embodiment. Therefore the connection relationship of the internal elements and the actuation principle of the anti-interference circuit 562 can be understood with reference to the related paragraphs and FIG. 2 and will not be illustrated in details any further herein.

It should be supplemented that in the third embodiment the anti-interference module 560 has the impedance matching circuit 564. The impedance matching circuit 564 aims to match the impedance of the anti-interference circuit 562. Accordingly, a comparator is not necessary for the impedance matching circuit 564, and the impedance matching circuit 564 only needs to be provided with a corresponding resistor to match with the impedance of the anti-interference circuit 562, such as the first resistor R1b, the second resistor R2b (optional), the third resistor R3b, the fourth resistor R4b and the fifth resistor R5b of the impedance matching circuit 564 in FIG. 7. However, many methods can be used to realize the impedance matching and the invention is not limited to this resistor arrangement method.

Figure 8:
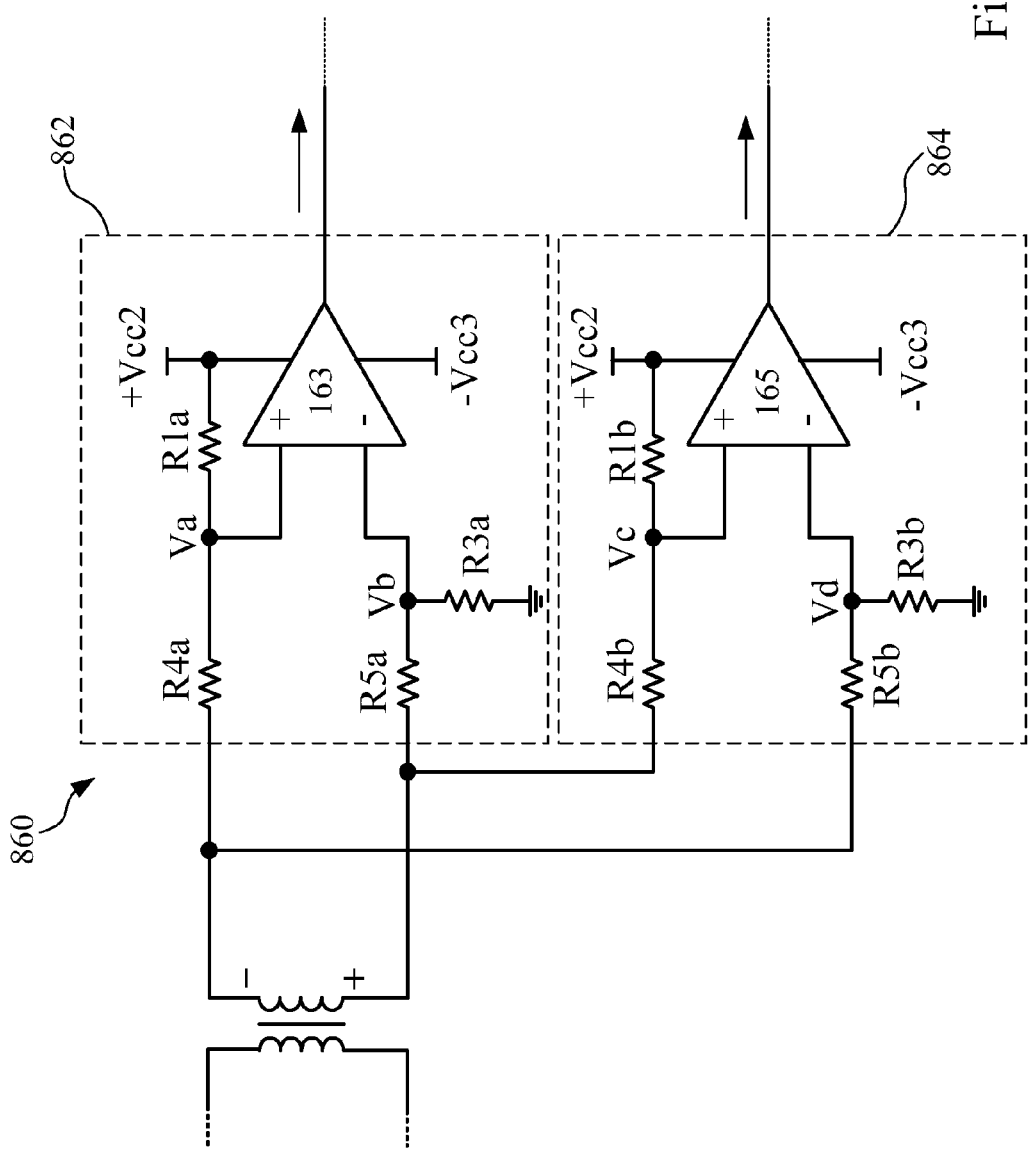
FIG. 8 is a schematic diagram illustrating an anti-interference module according to another embodiment of the invention.

In addition, the structure of the anti-interference circuit in this disclosure is not limited to the anti-interference circuit 162, 164 shown in FIG. 2 or the anti-interference circuit 562 shown in FIG. 7. Reference is made to FIG. 8, which is a schematic diagram illustrating an anti-interference module 860 according to another embodiment of the invention.

As shown in FIG. 8, the anti-interference module 860 includes a first anti-interference circuit 862 and a second anti-interference circuit 864, which are coupled to a positive polarity terminal and a negative polarity terminal of the secondary side respectively.

Each of the first anti-interference circuit 862 and the second anti-interference circuit 864 includes a comparator (163 or 165), a first resistor (R1a or R1b), a third resistor (R3a or R3b), a fourth (R4a or R4b) and a fifth (R5a or R5b).

In comparison to the first anti-interference circuit 162 shown in FIG. 2, the first anti-interference circuit 862 has similar connections but without the second resistor (R2a shown in FIG. 2). In this embodiment of the first anti-interference circuit 862, a resistance value of the first resistor R1a is approximately equal to a resistance value of the third resistor R3a. The details of functions, behaviors and components in the first anti-interference circuit 862 are similar to the components in the first anti-interference circuit 162 in aforesaid embodiment, and not to be repeated herein.

In view of the above, the invention provides a switch driving circuit which realizes the anti-interference and common-mode noise suppression effect based on the magnetic isolation transmission technology. The switch driving circuit is applicable to drive the full-controlled power switch element. The switch driving circuit of the invention has a short time delay of transmission, which is not limited by the frequency and pulse width of the control signal. At the same time, the switch driving circuit has the anti-interference and common-mode noise suppression circuit for improving the anti-interference capability. Additionally, with respect to the optical fiber, in the high voltage and high power application, the pulse transformer driving method has high stability and low cost.

Although the invention has been disclosed with reference to the above embodiments, these embodiments are not intended to limit the invention. It will be apparent to those of skills in the art that various modifications and variations can be made without departing from the spirit and scope of the invention. Therefore, the scope of the invention shall be defined by the appended claims.

What is claimed is:

1. A switch driving circuit for driving a full-controlled power switch, the switch driving circuit comprising:
   a pulse-width modulation unit for converting a driving input signal into a positive-negative narrow pulse-width signal;
   a pulse transformer having a primary side and a secondary side, wherein the primary side is coupled to the pulse-width modulation unit and the positive-negative narrow pulse-width signal is transferred to the secondary side through the pulse transformer;
   an anti-interference module coupled to the secondary side, wherein the positive-negative narrow pulse-width signal comprises a plurality of positive pulses and a plurality of negative pulses, each of the positive pulses and the negative pulse has a pulse amplitude, the anti-interference module filters out the positive pulses or the negative pulses which the pulse amplitude does not reach an effective threshold, and the anti-interference module suppress a common-mode noise caused by a high voltage transient variation produced when the full-controlled power switch is turned on or turned off;
   a pulse-width demodulation unit coupled to the anti-interference module, for converting the filtered positive-negative narrow pulse-width signal into a driving output signal; and
   a driving-power amplifier coupled between the pulse-width demodulation unit and the full-controlled power switch,
   wherein each of the driving input signal and the driving output signal is a pulse-width modulation signal, the positive pulses of the positive-negative narrow pulse-width signal correspond to rising edges of the driving input signal or the driving output signal, respectively, and the negative pulses of the positive-negative narrow pulse-width signal correspond to falling edges of the driving input signal or the driving output signal, respectively.

2. The switch driving circuit of claim 1, wherein the anti-interference module comprises a first anti-interference circuit and a second anti-interference circuit which are coupled to a positive polarity terminal and a negative polarity terminal of the secondary side respectively, each of the first anti-interference circuit and the second anti-interference circuit comprises:
   a comparator having a positive input terminal and a negative input terminal;
   a first resistor coupled between the positive input terminal and a power supply voltage; and
   a third resistor coupled between the negative input terminal and the ground terminal.

3. The switch driving circuit of claim 2, wherein the negative input terminal of the comparator in the first anti-interference circuit is coupled to the positive polarity terminal, the positive input terminal of the comparator in the first anti-interference circuit is coupled to the negative polarity terminal.

4. The switch driving circuit of claim 3, wherein the positive input terminal of the comparator in the second anti-interference circuit is coupled to the positive polarity terminal, and the negative input terminal of the comparator in the second anti-interference circuit is coupled to the negative polarity terminal.

5. The switch driving circuit of claim 4, wherein a resistance value of the first resistor is approximately equal to a resistance value of the third resistor.

6. The switch driving circuit of claim 4, wherein the first anti-interference circuit further comprises:
   a fourth resistor coupled between the negative polarity terminal and the positive input terminal of the comparator in the first anti-interference circuit; and
   a fifth resistor coupled between the positive polarity terminal and the negative input terminal of the comparator in the first anti-interference circuit, wherein a resistance value of the fourth resistor is approximately equal to a resistance value of the fifth resistor.

7. The switch driving circuit of claim 4, wherein the second anti-interference circuit further comprises:
   a fourth resistor coupled between the positive polarity terminal and the positive input terminal of the comparator in the second anti-interference circuit; and
   a fifth resistor coupled between the negative polarity terminal and the negative input terminal of the comparator in the second anti-interference circuit, wherein a resistance value of the fourth resistor is approximately equal to a resistance value of the fifth resistor.

8. The switch driving circuit of claim 4, wherein the pulse-width demodulation unit comprises a logic chip for setting and resetting, the logic chip comprises a setting input terminal and a resetting input terminal, an output terminal of the comparator in the first anti-interference circuit is coupled to the setting input terminal, and an output terminal of the comparator in the second anti-interference circuit is coupled to the resetting input terminal.

9. A switch driving circuit for driving a full-controlled power switch, the switch driving circuit comprising:
   a signal processing circuit for amplifying a driving capability of an ultra-high frequency driving input signal to generate an ultra-high frequency driving signal;
   a pulse transformer having a primary side and a secondary side, wherein the primary side is coupled to the signal processing circuit and the ultra-high frequency driving signal is transferred to the secondary side through the pulse transformer;
   an anti-interference module coupled to the secondary side, wherein the ultra-high frequency driving signal comprises a plurality of pulses, each of the pulses has a pulse amplitude, and the anti-interference module filters out the pulse which the pulse amplitude does not reach an effective threshold; and
   a driving-power amplifier coupled between the anti-interference module and the full-controlled power switch, the driving-power amplifier being configured to amplify a power of the filtered ultra-high frequency driving signal.

10. The switch driving circuit of claim 9, wherein the anti-interference module comprises a first anti-interference circuit and a second anti-interference circuit which are coupled to a positive polarity terminal and a negative polarity terminal of the secondary side respectively, each of the first anti-interference circuit and the second anti-interference circuit comprises:
    a comparator having a positive input terminal and a negative input terminal;
    a first resistor coupled between the positive input terminal and a power supply voltage;
    a third resistor coupled between the negative input terminal and the ground terminal;
    a fourth resistor coupled between the positive input terminal and the negative polarity terminal; and
    a fifth resistor coupled between the negative input terminal and the positive polarity terminal.

11. The switch driving circuit of claim 10, wherein, a resistance value of the first resistor is approximately equal to a resistance value of the third resistor, a resistance value of the fourth resistor is approximately equal to a resistance value of the fifth resistor.

12. The switch driving circuit of claim 11, wherein in the first anti-interference circuit the negative input terminal of the comparator is coupled to the positive polarity terminal and the positive input terminal is coupled to the negative polarity terminal; and in the second anti-interference circuit the positive input terminal of the comparator is coupled to the positive polarity terminal and the negative input terminal is coupled to the negative polarity terminal.

13. The switch driving circuit of claim 9, wherein the anti-interference module comprises an anti-interference circuit and an impedance matching circuit which are coupled to a positive polarity terminal and a negative polarity terminal of the secondary side respectively, the impedance matching circuit matches an impedance of the anti-interference circuit, wherein the anti-interference circuit comprises:
    a comparator having a positive input terminal and a negative input terminal, wherein the negative input terminal is coupled to the positive polarity terminal and the positive input terminal is coupled to the negative polarity terminal;
    a first resistor coupled between the positive input terminal and a power supply voltage;
    a third resistor coupled between the negative input terminal and the ground terminal;
    a fourth resistor coupled between the positive input terminal and the negative polarity terminal; and
    a fifth resistor coupled between the negative input terminal and the positive polarity terminal.

14. The switch driving circuit of claim 13, wherein a resistance value of the first resistor is approximately equal to a resistance value of the third resistor, and a resistance value of the fourth resistor is approximately equal to a resistance value of the fifth resistor.

* * * * *